United States Patent
Stong et al.

(10) Patent No.: US 7,257,751 B2
(45) Date of Patent: Aug. 14, 2007

(54) APPARATUS AND METHOD FOR RANDOM PATTERN BUILT IN SELF-TEST

(76) Inventors: Gayvin E Stong, 1442 Patterson Pl., Fort Collins, CO (US) 80526; Jeffrey Thomas Robertson, 8461 Calumet Way, Wellington, CO (US) 80549; David James Mielke, 3019 Cumberland Ct., Fort Collins, CO (US) 80526

( * ) Notice: Subject to any disclaimer, the term of this patent is extended or adjusted under 35 U.S.C. 154(b) by 878 days.

(21) Appl. No.: 10/021,374

(22) Filed: Oct. 30, 2001

(65) Prior Publication Data

US 2003/0093735 A1 May 15, 2003

(51) Int. Cl.
*G01R 31/28* (2006.01)
(52) U.S. Cl. .................................................. 714/733
(58) Field of Classification Search ................ 714/733, 714/718, 719, 723, 739; 365/201, 200
See application file for complete search history.

(56) References Cited

U.S. PATENT DOCUMENTS

| | | | | |
|---|---|---|---|---|
| 5,974,579 A | * | 10/1999 | Lepejian et al. | 714/733 |
| 6,014,336 A | * | 1/2000 | Powell et al. | 365/201 |
| 6,463,422 B1 | * | 10/2002 | Hangartner | 706/14 |

OTHER PUBLICATIONS

"Logic Design Principles With Emphasis On Testable Semicustom Circuits" by Edward J. McCluskey, published by Prentice-Hall. 1986. Section 10.6 pp. 455-474.

* cited by examiner

*Primary Examiner*—Albert Decady
*Assistant Examiner*—James C. Kerveros

(57) ABSTRACT

An apparatus permits built-in self-test ("BIST") of an IC that includes a memory element having more than one impermissible operation. A code generator accepts a clock signal and generates a test code in response to it. A decoder accepts the test code and generates at least two output lines to disable the impermissible operations during the test. When the decoder is in a decode disabled condition, the output lines reflect a value that permit all possible memory operations.

17 Claims, 4 Drawing Sheets

APPARATUS AND METHOD FOR RANDOM PATTERN BUILT IN SELF-TEST

BACKGROUND

An integrated circuit ("IC") experiences different kinds of testing during its production lifecycle. After an IC is manufactured, a high coverage IC test on a dedicated IC tester finds any defects that may have occurred during manufacturing. After assembling the IC to a printed circuit board ("PCB"), an in-circuit board test tests whether the IC was assembled to the PCB properly and whether any damage occurred during the assembly process. Upon return of a PCB from the field, an in-circuit board tester may attempt to identify and locate a faulty part for replacement. Typically, an in-circuit board tester is limited in the speed and memory capacity which it can draw upon to test a single IC on the PCB and the comprehensiveness with which it can test all failure modes for the IC. It is beneficial, therefore, to have a test that may be run at the PCB level, that is reasonably fast, while using limited board tester resources. Conventionally, this kind of test is controlled by the individual IC's that populate the PCB and is conventionally known as an IC's built in self-test ("BIST").

One type of BIST stimulates the inputs of the IC with a pseudo-random bit sequence and records a reference signature of the IC outputs from an IC known to be operational. The BIST then stimulates the IC to be tested with the same pseudo-random bit sequence and compares the resulting signature with the recorded reference signature. If the resulting signature matches the reference signature, the part is considered functional and passes the BIST. Another type of BIST shifts random patterns into scanpaths on a chip, steps a clock, and then compresses the results into a signature that can be compared to the signature for a known good part.

Certain IC's present a challenge for BIST using pseudo-random bit sequences shifted into registers on the IC. One kind of IC that presents this challenge is an IC comprising one or more memory elements. When using a random number stimulus BIST for an IC with memory elements, patterns that would not occur during normal operation may be shifted into registers. These non-standard register contents can create contention conditions that would not occur during actual operation of the IC. An example of such a contention condition is a stimulus that attempts to read and write to the same location in a memory element. The logic timing of the simultaneous read and write is non-deterministic. Accordingly, a BIST result that included the simultaneous read and write is also non-deterministic, thereby rendering the test unusable for its intended purpose.

Because contention conditions compromise the repeatability of a BIST resulting signature, some prior art solutions test the IC logic first and thereafter test the memory elements with a stimulus that creates only repeatable resulting signatures. This dual mode testing method disadvantageously adds time to the overall test of the IC. Additionally, because this method tests the logic separately from the memory, it may not adequately stimulate the interface logic between the logic and memory sections of the IC and the IC may not receive full test coverage. There is a need, therefore, for an apparatus and method permitting simultaneous BIST testing of the logic and memory elements within an IC.

Some prior art solutions for testing the logic and memory elements simultaneously require additional logic circuitry dedicated to the memory element BIST. The additional logic circuitry represents BIST overhead and takes up space on the IC die. To the extent that logic gates dedicated to BIST testing are inserted in series with other IC logic, this overhead inserts timing delays in the IC's normal operation. This overhead adds to the production costs of the IC and may compromise IC performance, which either increases price or decreases profit. While the BIST overhead for an IC with a large number of relatively small memory elements is greater from a relative perspective than an IC with a few relatively large memory elements, as a general proposition it is universally beneficial to reduce the amount of BIST overhead present on an IC. There is a need, therefore, for an apparatus and method for a reliable IC BIST that permits simultaneous testing of logic and memory elements while adding minimal overhead circuitry and logic timing delays to the IC.

SUMMARY

An apparatus according to the teachings of the present invention comprises a memory element having one or more impermissible operations and a plurality of memory access lines. A code generator accepts a clock signal and generates a test code in response to it. A decoder accepts the test code and generates at least two output lines where when in a decode enabled condition, the output lines are responsive to the test code and reflect a value that when combined with respective memory access lines disables the one or more impermissible operations. When the decoder is in a decode disabled condition, the output lines reflect a value that when combined with the respective memory access lines enables all possible memory operations.

A method according to the teachings of the present invention for built in self test of an integrated circuit including a memory element, said memory element having one or more impermissible operations, comprises the steps of storing a seed value into a code generator, generating a test code in response to a clock signal, and mapping said test code to at least two output lines. The steps continue by combining respective ones of the output lines with a memory operation signal to generate a memory access enable signal, where when in a test code enabled condition, the step of mapping causes the output lines to reflect values that when performing the step of combining, the resulting memory access enable signals disable the one or more impermissible operations. Furthermore, when in a test code disabled condition, the step of mapping causes the output lines to reflect values that when performing the step of combining, the resulting memory access enable signals permit all possible memory operations without intervention. The method completes by accessing the memory element according to the memory access enable signals.

In another embodiment of an apparatus for built in self test of a printed circuit board according to the teachings of the present invention comprises at least one logic circuit, at least one memory element having one or more impermissible operations, and a plurality of memory access lines for each memory element. A code generator for each memory element accepts a clock signal and generates a test code for each memory element in response to the clock signal. The apparatus further comprises a decoder for each memory element. Each decoder accepts the test code and generates at least two output lines for each memory element where, when in a decode enabled condition, the output lines are responsive to the test code and reflect a value that when combined with respective memory access lines disables the one or more impermissible operations. When in a decode disabled condition the output lines reflect a value that when combined with the respective memory access lines enables all possible memory operations.

In another embodiment of a method according to the teachings of the present invention for a built in self test of a printed circuit board including at least one logic circuit and at least one memory element comprises the steps of storing known seed values into a plurality of registers on the printed circuit board, placing the printed circuit board in a test code enable condition, storing seed values into at least one test code generator, and stimulating the printed circuit board with a clock signal. The method further comprises the steps of generating a test code for each one of the at least one test code generators in response to the clock signal and mapping each generated test code to at least two output lines where when in a test code enabled condition, only one of the output lines reflects an active value during any one state. The method continues by combining respective ones of the output lines with a memory operation signal to generate a memory access enable signal, accessing the memory element, and comparing a resulting test signature with a known good test signature.

Advantageously, the teachings of the present invention provide for BIST simultaneously with the logic section of the IC using a pseudo-random bit sequence stimulus of one or more memory elements on an IC.

DETAILED DESCRIPTION

The teachings of the present invention specifically address a solution to the contention condition wherein the BIST of an IC containing one or more memory elements presents the possibility of reading and writing to the same location of one or more memory elements or writing two different values to the same location of one or more memory elements. During normal operation, such a condition does not occur due to handshaking, interfacing with other IC's on the PCB, and other controls handled in software that drive the system. BIST, however, tests a single IC in isolation. Accordingly, a pseudo-random bit sequence stimulus is able to generate non-deterministic contention conditions, which must be addressed in order to render the BIST a reliable indicator of IC operability.

Figure 1:
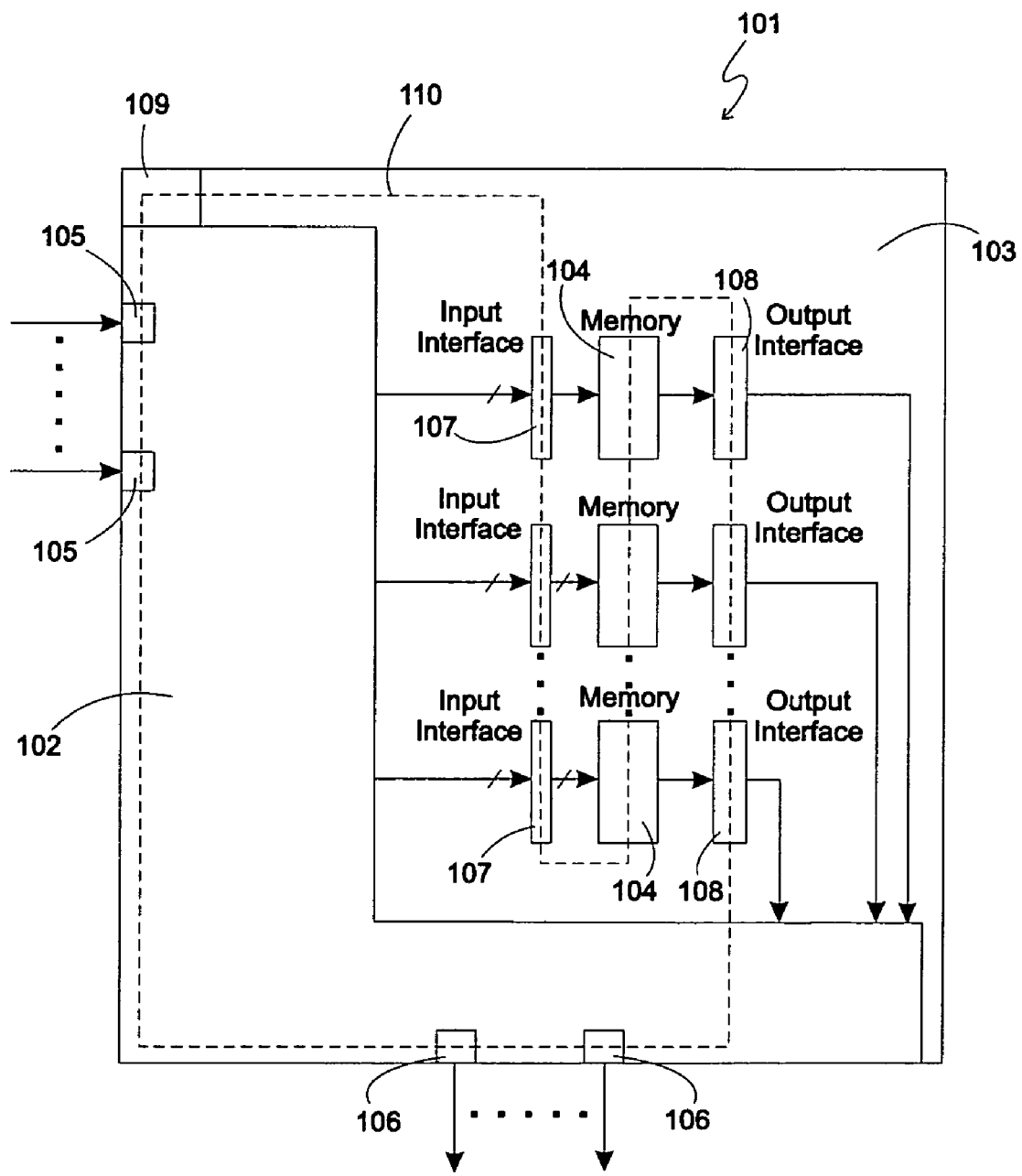
FIG. 1 is a conceptual illustration of an IC having both logic and memory sections.

With specific reference to FIG. 1 of the drawings, there is shown a conceptual rendering of an IC 101 that includes a section containing IC logic stages 102 and a memory section 103 containing a plurality of memory elements 104. As one of ordinary skill in the art appreciates, the actual IC layout will ordinarily not have the highly segmented functional elements as shown in the illustration. FIG. 1, therefore, is for illustrative purposes only to aid in the conceptual description herein. The IC 101 also includes either input ports 105 and output ports 106 or scannable registers internal to the IC and accessible through test access port 109. The serial accessibility of the scannable registers in the IC are represented by dotted line 110. Test access port 109 is conventionally a serial access to internal IC registers with access being defined in the IEEE-1149.1 JTAG standard. In some cases, the ports may be bi-directional or may include both input and output ports 105, 106 and the test access port 109. The BIST test is performed by shifting pseudo-random patterns into the registers on the IC from the test access port 109. The pins of the IC including the input and output ports 105, 106 are placed in a known state and are held in that state during the BIST test. In a disclosed embodiment, there are approximately one hundred memory elements 104 that comprise the memory section 103 on the IC. Each memory element 104 comprises a memory array that may be anywhere from 72 bits wide having 512 entries to 32 bits wide and having 16 entries. The memory elements 104 each have a respective input interface logic 107 and output interface logic 108 associated with it. The input and output interface logic comprises logic gates and buffers that perform specialized functions used for proper communication between the IC logic stages 102 and the memory elements 104.

Figure 2:
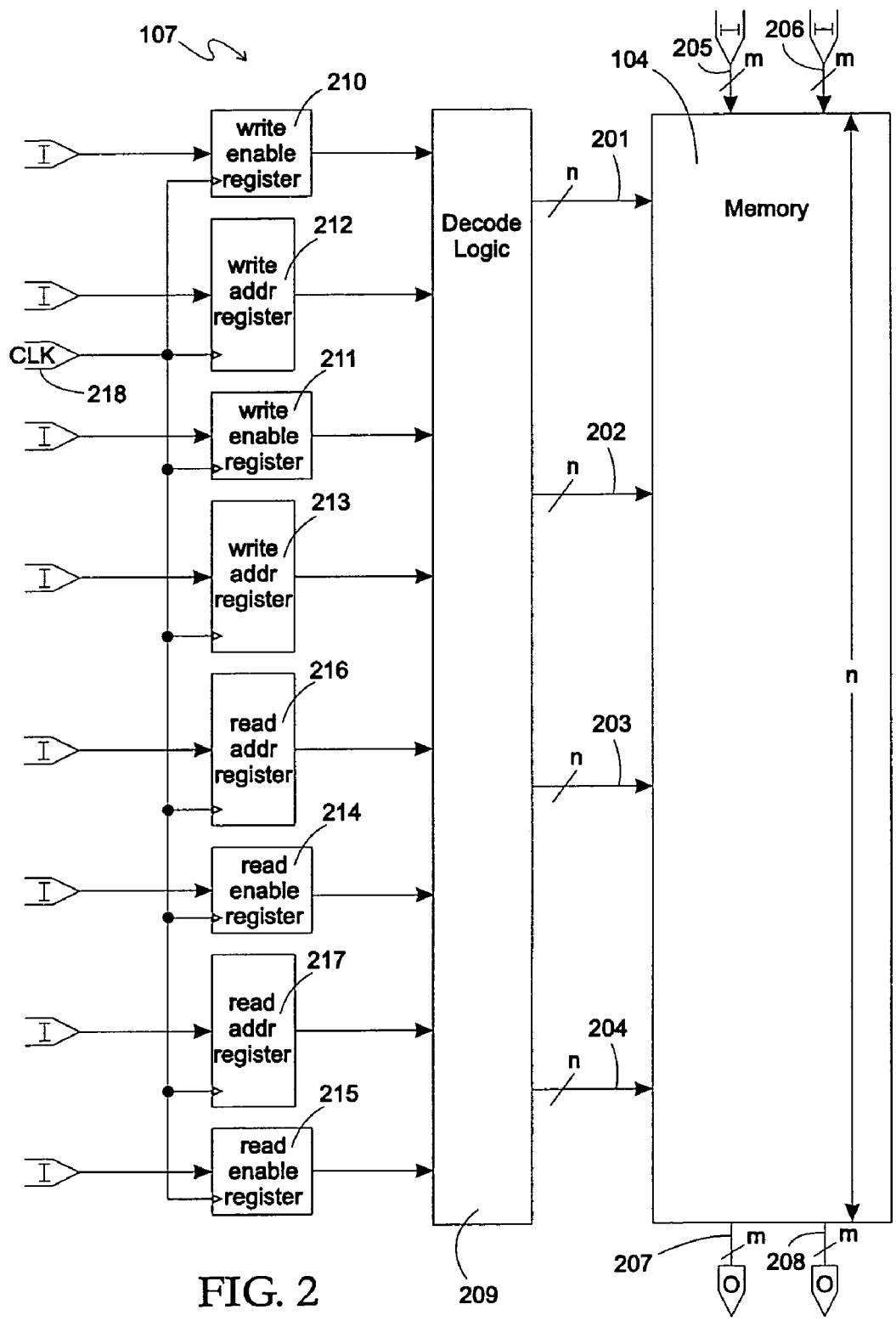
FIG. 2 is a diagram of a subset of the IC memory section including a single memory element and supporting registers.

With specific reference to FIG. 2 of the drawings, there is shown a memory element 104 having first and second write select buses 201, 202 and first and second read select buses 203, 204. This configuration represents a 2-port memory element 104. The teachings of the present invention, however, may be applied to single port and other multi-port configurations by one of ordinary skill in the art. Each bus 201, 202, 203, 204 is n bits wide with n representing the total number of entries in the memory element 104. A positive value on any line in any one of the buses 201, 202, 203, 204 will cause an operation, either a read or a write, to occur with respect to the entry in the memory element corresponding to the positive value. The memory element 104 also comprises first and second data input buses 205, 206 and first and second data output buses 207, 208. Each data input bus 205, 206 and data output bus 207, 208 are m bits wide, where m represents the bit width of the memory element 104. When the first write select bus 201 points to a memory entry location, the source of data that is written to the memory entry specified is the first data input bus 205. Similarly, when the second write select bus 202 points to a memory entry location, the source of the data that is written to the entry specified is the second data input bus 206. When the first read select bus 203 points to a memory entry location, the destination of the data in the memory entry specified is the first data output bus 207. Similarly, when the second read select bus 204 points to a memory entry location, the destination of the data in the memory entry specified is the second data output bus 208. The input interface logic 107 comprises decode logic 209, the output of which is the first and second read select buses 201, 202 and first and second write select buses 203, 204. The stage before the decode logic 209 comprises first and second write enable registers 210, 211 and first and second write address registers 212, 213. The stage before the decode logic 209 also comprises first and second read enable registers 214, 215 and first and second write enable registers 216, 217. All read and write enable and address registers receive a clock signal 218 to latch in and hold data that is presented to the input interface logic 107.

As one of ordinary skill in the art will note, the first and second read/write select buses may cause more than one operation to occur at the same entry location within the memory element 104. During normal operation, it is beneficial that the IC can write to different memory locations simultaneously. Simultaneous write/write or read/write operations to the same entry in the memory element 104, however, produce non-deterministic results. These impermissible operations are disabled as part of the proper function of the IC 101 in the context of the system. A BIST using a pseudo-random stimulus, however, tests the IC in isolation and not as part of the system running under normal conditions. The simultaneous write/write and read/write operations to the same memory element location, therefore, are within the realm of possibility during BIST.

Figure 3:
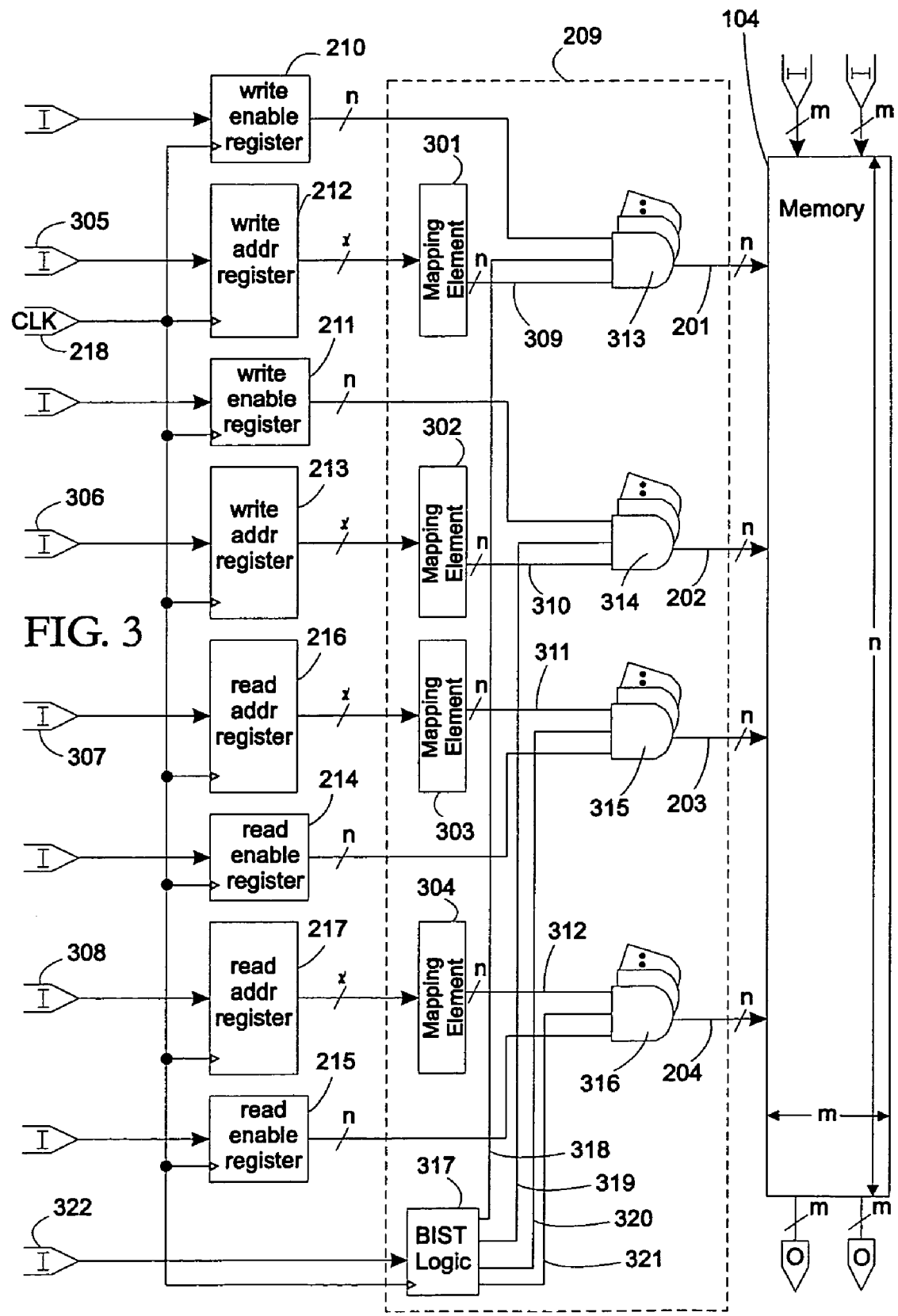
FIG. 3 is an illustration showing further detail view of the memory element logic according to the teachings of the present invention including the registers shown in FIG. 2 and also the logic supporting the register to memory interface.

With specific reference to FIG. 3 of the drawings, there is shown a more detailed drawing of the decode logic 209 in which each enable register/address register pair 210/212, 211/213, 214/216, and 215/217 has a mapping element 301, 302, 303, and 304, respectively. In the disclosed embodiment, the first and second write address registers 212, 213 and the first and second read address registers 216, 217 all receive x-bits of address at first and second write address ports 305, 306 and first and second read address ports 307, 308. The x-bits of address are latched into the address registers 212, 213, 214, 215 and are presented to the respective mapping elements 301, 302, 303, 304. Each mapping element 301, 302, 303, and 304 has n outputs. As an example, if x=4, then n=16 because 4 bits of address can map to each one of 16 outputs. As one of ordinary skill in the art appreciates, however, it is also acceptable to map more than 4 bits to 16 outputs. The mapping elements 301–304 comprise a network of logic gates that decode the x-bit input into the desired n-bit output. The actual mapping and logic network to realize the mapping, depends upon the needs of the specific circuit. Each permutation of the x-bit address presents an n-bit wide mapped word at memory access lines comprising first and second write address outputs 309, 310 and at memory access lines comprising first and second read address outputs 311, 312 of each mapping element 301, 302, 303, 304. Each bit of the mapped word presented at the first write address output 309 is fed into a first write bank 313 of 3-input AND gates. Similarly, each bit of the mapped word presented at the second write address output 310 is fed into a second write bank 314 of 3-input AND gates. Each bit of the first and second read address outputs 311, 312 are fed into respective first and second read banks 315, 316 of 3-input AND gates. For a 2-input/2-output memory element 104, this results in a total of 4 banks 313, 314, 315, 316 of n 3-input AND gates in the disclosed embodiment. Each output bit of each n 3-input AND gate corresponds to one of the n entries in the memory element 104 where an active value on any one bit directs a read or write operation to occur.

An output of the first and second write enable registers 210, 211 and the first and second read enable registers 214, 215 is a single enable bit. The enable bits also comprise the memory access lines. An output of the first write enable register 210 is fed into all gates in the first write bank 313 of AND gates and are conjunctively combined with respective bits of the mapped word at the first write address output 309. Similarly, outputs of the second write enable register 211, and the first and second read enable registers 214, 215 are fed into all gates in respective second write bank 314 and first and second read banks 315, 316 of AND gates and are conjunctively combined with respective bits of the mapped words at the second write address output 310 and first and second read address outputs 311, 312. As one or ordinary skill in the art can appreciate, the output of the first and second write enable registers 210, 211 and the first and second read enable registers 214, 215 inhibit or permit values presented as the first and second write address outputs 309, 310, respectively, and the first and second read address outputs 315, 316, respectively, to also be presented at the first and second write select buses 201, 202 respectively, and the first and second read select buses 203, 204, respectively.

In addition to the enable bit output of the first and second write enable registers 210, 211 and the first and second read enable registers 214, 215, each AND gate that makes up the first and second write banks 313, 314 and the first and second read banks 315, 316 also receives a signal from a test control stage 317. Each AND gate of the first and second write banks 313, 314 receives first and second write test control enable signals 318, 319 respectively. Similarly, each AND gate of the first and second read banks 315, 316 receives first and second read test control enable signals 320, 321, respectively. The test control stage 317 receives a test control signal 322 to enable or disable the test mode for the IC. The logic that makes up the test control stage 317 exists solely for the purpose of running the BIST. As one of ordinary skill in the art can appreciate, because each test control enable signal 318, 319, 320, 321 is conjunctively combined with the first and second write address outputs 309, 310 and the first and second read address outputs 311, 312, respectively, the test control enable signal 318, 319, 320, 321 will permit or inhibit a read or a write operation to occur. In order to prevent the impermissible write/write and write/read operation to the same memory element entry, only one of the test control enable signals 318, 319, 320, 321, is active during any one clock cycle. This renders any write operation mutually exclusive of any other read or write.

During normal operation, the test control signal 322 is inactive, which disables the test control stage 317. When the test control stage 317 is disabled, all test control enable signals 318, 319, 320, 321 are set to an active value. Because each test control enable signal 318, 319, 320, 321 is conjunctively combined with the outputs of respective first and second write enable registers 210, 211 and first and second read enable registers 214, 215, an active value for all of the test control enable signals 318, 319, 320, 321, advantageously renders the test control stage transparent to the supporting memory stage 103 logic in both function and timing. Accordingly, the simultaneous read/write and write/write operations are permitted to occur because other logic assures that these operations do not occur at the same memory element entry.

Figure 4:
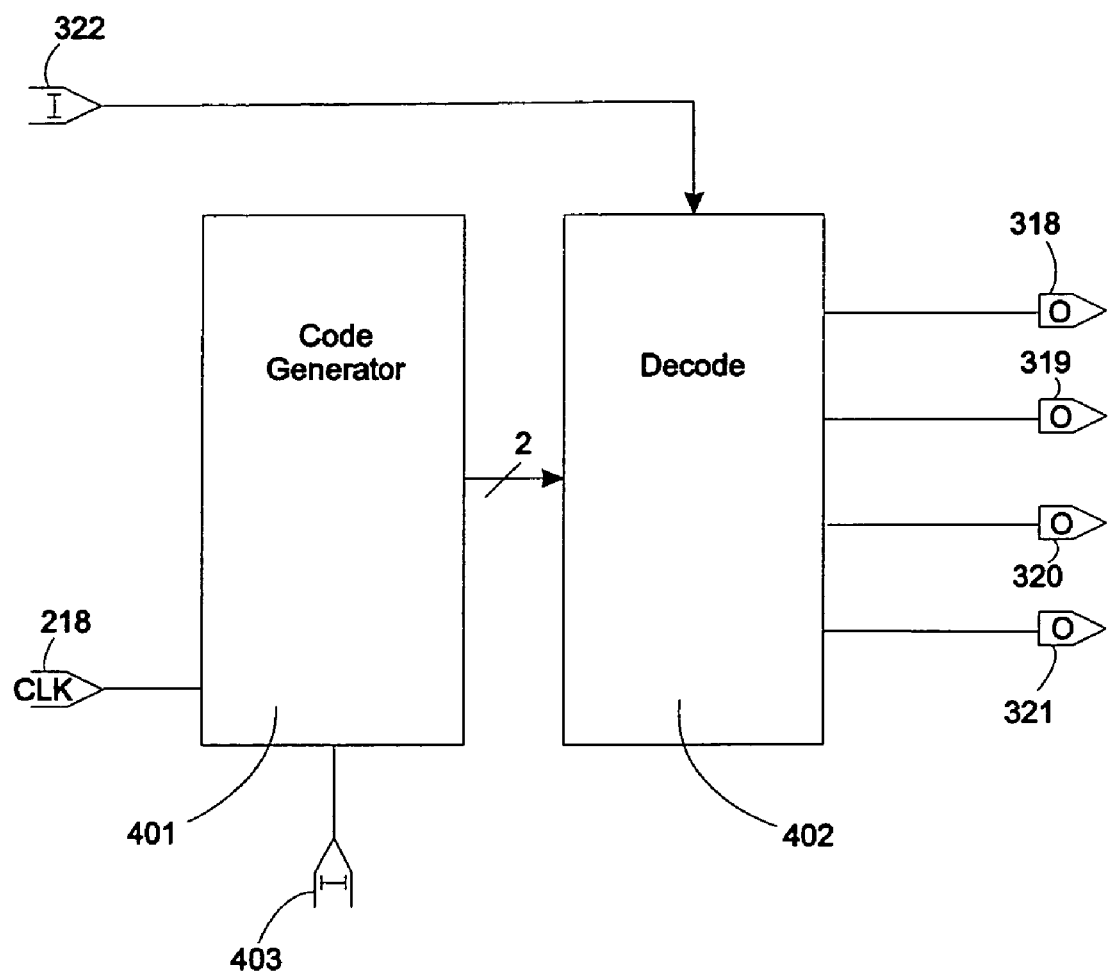
FIG. 4 is a further detailed view of a subset of the supporting logic for the memory element including circuitry dedicated to the BIST according to the teachings of the present invention.

Pulling the test control signal 322 active enables the test mode. With specific reference to FIG. 4 of the drawings, there is shown a detailed illustration of the test control stage 317. The test control stage 317 disclosed is for a 2 port read/2 port write memory element 104. It accepts the test control signal 322 and the clock signal 218 and generates the 4 test control enable signals 318, 319, 320, 321 that enable or inhibit the read and write operations on the memory element 104. The test control stage 317 comprises a 2-bit code generator 401 and a test control decoder 402. In a first embodiment, the code generator 401 comprises a 2-bit counter. The 2-bit counter can be either an up-counter, a down-counter, or a random code generator. The code generator 401 receives a seed value via code generator input 403. Each transition of the clock signal 218 causes the code generator 401 to generate a new code for each subsequent clock cycle. An output of the code generator 401 is fed to the test control decoder 402. In the first embodiment, the test control decoder 402 is a 4 entry, 4-bit wide ROM that performs a simple mapping function. If the test control signal 322 is active, the test control decoder 402 maps the output of the code generator 401 to a 4-bit value that is presented as the first and second test write enable signals 318, 319 and the first and second test read enable signals 320, 321. The 4-bit values programmed into the test control decoder 402 assure that all memory operations are mutually exclusive of each other. Because only one read or write operation occurs at any one time, any impermissible operation stimulated by the BIST is disabled. Advantageously, there is minimal additional logic added for disabling the impermissible operations during BIST. Although implemented in the first embodiment, it is not necessary that all of the enable signals 318, 319, 320, 321 be mutually exclusive of each other. The mutual exclusivity in the disclosed embodiment merely simplifies the programming while obviating any occurrence of the impermissible operations. In the disclosed embodiment, a read/read operation is permissible. Accordingly, the first and second read enable signals 320, 321 may both be active at the same time. The present logic uses conjunctive combinations. As an alternative implementation, the logic may be adjusted to use a disjunctive format and a "negative active" polarization when the logic technology makes it advantageous to do so.

As one of ordinary skill in the art can appreciate, the teachings of the present invention may be scaled up or down depending upon the needs of the memories to be tested. As an example, a 1-port read/1-port write memory element 104 could implement the teachings of the present invention with a toggle flip-flop element where the read port received an enable signal and the write port received the enable signal through an inverter. The teachings of the present invention may also be scaled for use with a higher number of ports. In the higher scaled embodiments, the code generator 401 is a 3-bit or higher counter (up-counter or down-counter) and the decoder 402 has as many entries as may be addressed by the code generator 401. Alternatively, the decoder 402 may map more than one code to the enable lines as appropriate. Advantageously, the mapped aspect of the teachings of the present invention provide for flexibility of BIST without significantly increasing the logic overhead required for its implementation.

The teachings of the claimed invention are described by way of example. This disclosure, therefore, is illustrative and not limitive of that which is claimed.

The invention claimed is:

1. An apparatus comprising:
   a memory element in an integrated circuit, the memory element having at least one deterministic operation and at least one non-deterministic operation controllable by at least two control lines; and
   a code generator accepting a seed input and generating a sequence of test codes in response to a clock signal,
   a decoder accepting the test codes and remapping each test code to at least two test enable signals wherein the test enable signals logically combine with the control lines to stimulate only deterministic operations when in a test enabled condition.

2. An apparatus as recited in claim 1 wherein said code generator comprises a counter.

3. An apparatus as recited in claim 1 wherein said code generator comprises a random number generator.

4. An apparatus as recited in claim 1 wherein said memory element comprises a multiple port memory element.

5. An apparatus as recited in claim 4 wherein one of the non-deterministic operations is a multiple write operation.

6. An apparatus as recited in claim 4 wherein one of the non-deterministic operations is a simultaneous read and write operation.

7. An apparatus as recited in claim 1 wherein when in a test enabled condition said decoder maps a specific state for each test code to a unique state of the enable signals.

8. An apparatus as recited in claim 1 wherein when in a test enabled condition said decoder maps more than one test code state to a single state of the enable signals.

9. An apparatus as recited in claim 1 wherein there are at least two different memory elements and each memory element has associated with it a respective code generator and respective decoder.

10. An apparatus as recited in claim 1 wherein the decoder is a look up table implemented in a read only memory.

11. A built in self test method, comprising:
    providing an integrated circuit having a memory element, the memory element having at least one deterministic operation and at least one non-deterministic operation controllable by at least two control lines;
    generating a sequence of test codes from a seed input in response to a clock signal,
    remapping the test codes to at least two test enable signals, and
    logically combining the test enable signals with the control lines to stimulate only the deterministic operations when in a test enabled condition.

12. A method as recited in claim 11 wherein said step of generating a test code comprises the step of generating a random number as said test code.

13. A method as recited in claim 11 wherein said step of generating a test code comprises the step of generating sequential numbers as said test code.

14. A method as recited in claim 11 and further comprising the step of driving all test enable signals to a constant value when in a test code disabled condition.

15. A method as recited in claim 11 wherein the step of mapping further comprises mapping a value for each test code to a unique state of the test enable signals.

16. A method as recited in claim 11 wherein the step of mapping further comprising mapping more than one test code to a single state of the enable signals.

17. A method as recited in claim 11 and further comprising the steps of accessing contents of the memory element to obtain a test signature of the memory element, and comparing the test signature against a reference test signature.

* * * * *